United States Patent [19]

Oohashi et al.

[11] Patent Number: 4,964,694

[45] Date of Patent: Oct. 23, 1990

[54] OPTICAL FIBER AND APPARATUS FOR PRODUCING SAME

[75] Inventors: Keiji Oohashi, Sakura; Hideo Suzuki, Funabashi; Shinji Araki; Tsuyoshi Shimomichi, both of Sakura, all of Japan

[73] Assignee: Fujikura Ltd., Tokyo, Japan

[21] Appl. No.: 380,961

[22] Filed: Jul. 17, 1989

[30] Foreign Application Priority Data

| Jul. 26, 1988 | [JP] | Japan | 63-186467 |
| Sep. 9, 1988 | [JP] | Japan | 63-226022 |
| Jan. 12, 1989 | [JP] | Japan | 1-5535 |
| Apr. 28, 1989 | [JP] | Japan | 1-109572 |

[51] Int. Cl.$^5$ .............................. G02B 6/22
[52] U.S. Cl. .............................. 350/96.33; 350/96.34
[58] Field of Search ............... 350/96.29, 96.30, 96.33, 350/96.34

[56] References Cited

U.S. PATENT DOCUMENTS

| 4,319,803 | 3/1982 | Burmeister et al. | 350/96.33 |
| 4,512,629 | 4/1985 | Hanson et al. | 350/96.30 |
| 4,568,563 | 2/1986 | Jackson et al. | 350/96.33 X |
| 4,735,856 | 4/1988 | Schultz et al. | 350/96.30 X |
| 4,750,806 | 6/1988 | Biswas | 350/96.30 |
| 4,790,625 | 12/1988 | Biswas et al. | 350/96.33 |
| 4,874,222 | 10/1989 | Vacha et al. | 350/96.34 |

FOREIGN PATENT DOCUMENTS

| 0175980 | 4/1986 | European Pat. Off. |
| 0308143 | 3/1989 | European Pat. Off. |
| 1646924 | 6/1970 | Fed. Rep. of Germany |

OTHER PUBLICATIONS

"Recent Developments in Hermetically Coated Optical Fiber"; pp. 240–244, J. of Lightwave Tech., vol. 6, No. 2, Feb. 1988, Lu et al.
"Hydrogen Permeation in Optical Fibres with Hermetic Carbon Coatings" pp. 1323–1324, Electronics Lett., vol. 24, No. 21, Oct. 1988,. Lemaire et al.
"Amorphous Carbon Hermetically Coated Optical Fibers"; 1 pg., OFC 88, Huff et al.
"Hermetically Coated Optical Fibers"; pp. 241–244, Int. Wire & Cable Symp., 1987, Lu et al.

Primary Examiner—John D. Lee
Attorney, Agent, or Firm—Sprung Horn Kramer & Woods

[57] ABSTRACT

There is disclosed an optical fiber coated with a carbon layer in which carbon coating layer is formed by thermally decomposing a hydrocarbon or halogenated hydrocarbon compound having 15 or less carbon atoms. There is also disclosed an apparatus for producing the optical fiber coated with at least one carbon layer.

12 Claims, 2 Drawing Sheets

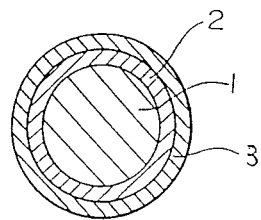
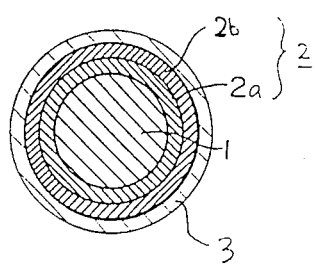
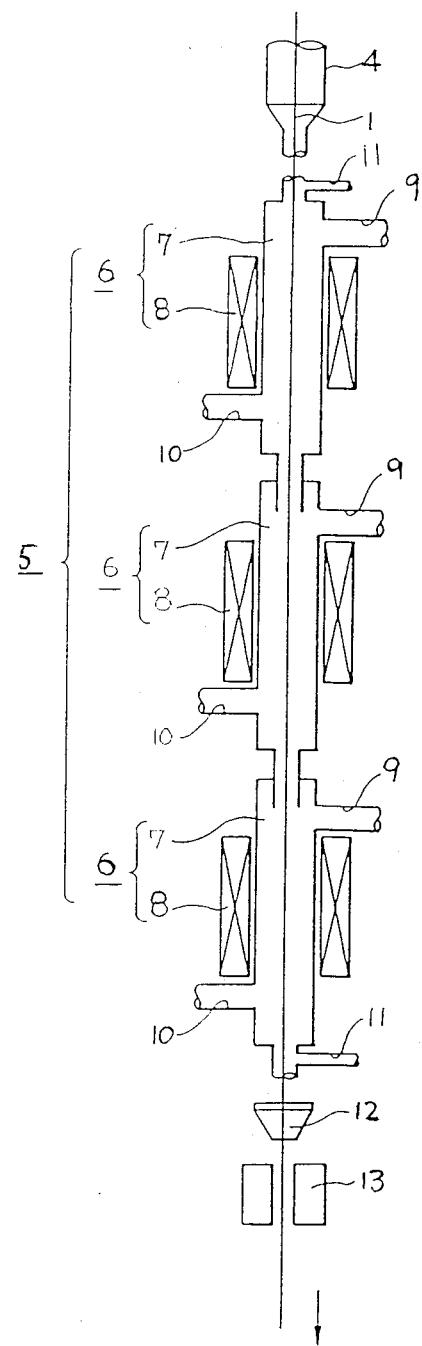

OPTICAL FIBER AND APPARATUS FOR PRODUCING SAME

BACKGROUND OF THE INVENTION

1. Field of the Invention

The present invention relates to carbon-coated optical fibers and apparatus for producing same.

2. Prior Art

Quartz-based optical fibers have been widely used for communications cables. Hydrogen coming into contact with these fibers can diffuse through them, and the molecular vibrations of the hydrogen lead to greater absorption losses. In addition, the hydrogen may react with $P_2O_3$, $GeO_2$, or $B_2O_3$, which are contained in the fiber as dopants, and forming compounds with one or more OH groups. Absorption by the OH group also increases absorption losses. One way to solve these problems is to add a liquid-phase composition which can absorb hydrogen in the fiber (Unexamined Japanese Patent Publication No. 61-251808). However, this method is impractical: the produced fiber has a limited capacity for hydrogen absorption and is structurally complex. Corning Glass (International Wire & Cable Symposium Proceedings 1987, pages 241-244, and JOURNAL OF LIGHTWAVE TECHNOLOGY, VOL. 6, No. 2, Feb. 1988, pages 240-244) and AT&T ELECTRONICS LETTERS, 13th Oct. 1988 Vol. 24, No. 21, pages 1323-1324, and OFC '88/TUESDAY AFTERNOON/23) have recently disclosed that coating the fiber with carbon by chemical vapor deposition (CVD) can enhance its resistance to hydrogen.

The hydrogen-resistance characteristics of this carbon coating and the mechanical properties of the carbon-coated fiber depend greatly on the carbon source and on deposition conditions. At present, the CVD process cannot yet produce optical fibers that are sufficiently hydrogen-resistant and mechanically strong.

SUMMARY OF THE INVENTION

Accordingly, it is an object of the present invention to provide an optical fiber having sufficient hydrogen-resistance and mechanical strength, as well as an apparatus for producing such fibers easily.

It is another object of the present invention to provide an apparatus for producing the above described optical fiber.

According to a first aspect of the present invention, there is provided an optical fiber which is coated with carbon prepared by thermally decomposing a hydrocarbon compound or halogenated hydrocarbon compound having 15 or less carbon atoms, a hydrocarbon or compound halogenated hydrocarbon compound at 400° to 1100° C., and a hydrocarbon compound or halogenated hydrocarbon compound having 15 or less carbon atoms at 400° to 1100° C., respectively. The carbon coating of each fiber works to prevent hydrogen from penetrating the body, thus reducing absorption loss in the fibers. The carbon coating also works as a reinforcing agent, making the fiber mechanically stronger.

The optical fiber according to the present invention may be coated with two carbon layers: the inner and outer layers, in that order, form over the uncoated surface. This coating has improved properties (such as resistance to cracking) over the single-layer coating because the double-layer structure reduces pinhole formation. The double-layer coating has better properties and sufficient thickness. Consequently, the optical fiber described in claim 4 of the present invention is mechanically stronger and has a lower transmission loss from hydrogen diffusion.

The optical fiber according to the present invention may be also coated with two carbon layers, but these layers come from different sources. The first layer is prepared by thermally decomposing an aromatic or halogenated aromatic hydrocarbon compound; the second layer is prepared by thermally decomposing an aliphatic or halogenated aliphatic hydrocarbon compound. As a result, each layer has different properties. The first layer, being softer and having a lower modulus of elasticity, absorbs stresses exerted on the fiber body. The second layer, being harder and having a higher modulus of elasticity, prevents hydrogen from penetrating into the body, thus greatly improving hydrogen resistance and mechanical strength. Furthermore, the softer first layer works as a buffer layer to absorb external stresses. The harder second layer acts as a protective layer. It prevents damage to the body of the fiber and improves the mechanical strength.

The optical fiber according to the present invention may be also coated with two carbon layers. The inner layer is prepared by thermally decomposing a halogenated hydrocarbon compound where at least half of the hydrogen atoms in the molecule are substituted by halogen atoms. The second layer is prepared by thermally decomposing a halogenated hydrocarbon compound where less than half of the hydrogen atoms in the molecule is substituted by halogen atoms. Thermal decomposition of a halogenated hydrocarbon compound in which at least half of the hydrogen atoms in the molecule are substituted by halogen atoms produces smaller quantities of H radicals. This improves the mechanical strength of the fiber because it limits the formation of Si-OH groups which damage the uncoated fiber surfaces. Thermal decomposition of halogenated hydrocarbon compounds produce a more hydrogen-resistant coating layer. Therefore, coating the inner carbon layer with the outer carbon layer improves the fiber's resistance to hydrogen absorption.

According to a second aspect of the present invention, there is provided an apparatus for producing optical fibers or for coating uncoated optical fiber surfaces with carbon. The apparatus comprises a chemical vapor-phase growth reaction furnace in which reactor tubes are connected in series. Each of the reactor tubes is provided with a feed compound supply tube. A feed compound that can be thermally decomposed into a carbon coating is supplied through the supply tube to the reaction furnace. The invention also includes an exhaust tube. The reactor furnace is designed to reduce the residence time of carbon radicals formed by thermal decomposition of the feed compound, to control polymerization of these radicals, and thereby to produce a high quality, hydrogen-resistant carbon layer. The length of the chemical vapor-phase growth reaction furnace can be increased by connecting a plurality of reaction tubes, thereby increasing contact time of uncoated optical fiber surfaces with carbon radicals. This increases the rate of carbon coating deposition and the speed of optical fiber spinning.

During the coating process, the optical fiber moves downward in the reaction tubes in the chemical vapor-phase growth furnace. This structure allows for the production of a more hydrogen-resistant optical fiber. If pinholes form in carbon coatings in an upper reaction tube, their growth can be controlled because the carbon coatings are further coated with additional carbon while the fiber moves downward in the reaction tubes.

BRIEF DESCRIPTION OF THE DRAWINGS

The present invention will now be illustrated with reference to the accompanying drawings wherein:

FIG. 1 is a cross-sectional view showing an optical fiber of an embodiment according to the present invention;

FIG. 2 is a cross-sectional view showing an optical fiber of the present invention;

FIG. 3 is a side view showing an apparatus of the present invention, the apparatus which produces the optical fiber having carbon coatings;

DESCRIPTION OF PREFERRED EMBODIMENTS OF THE INVENTION

Figure 4:
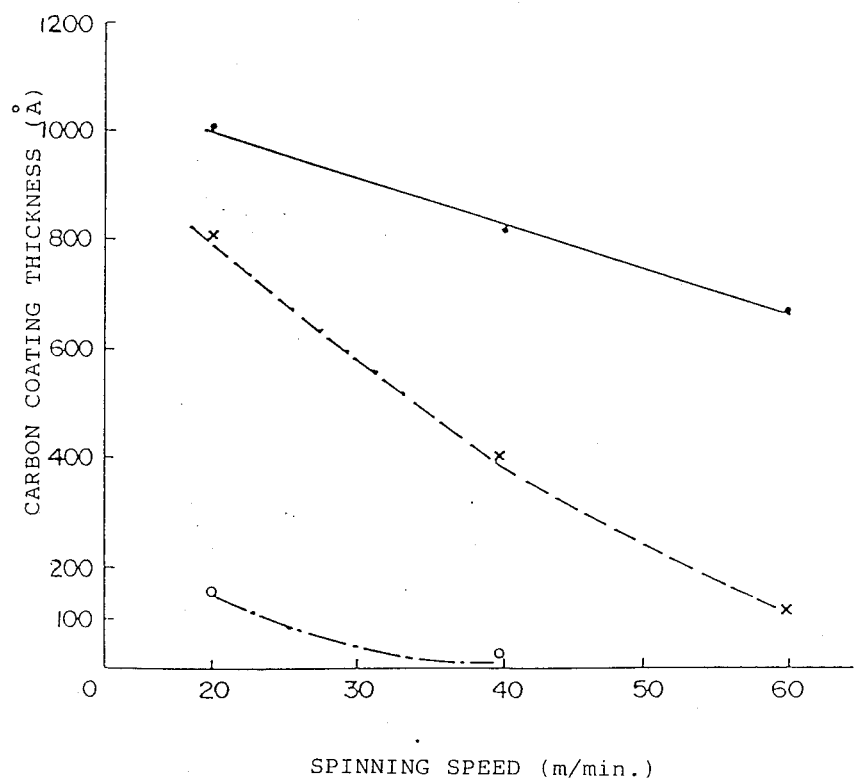
FIG. 4 is a diagram showing the relationship between carbon coating thickness and optical fiber spinning speed for the apparatus of the present invention and compares this relationship with that for a conventional apparatus.

FIG. 1 is an optical fiber according to the present invention, where an uncoated optical glass fiber 1 made of quartz or multi-component glass is coated with carbon coating layers 2 and 3 in that order; carbon coating layer 2 prevents diffusion of hydrogen into the uncoated optical fiber 1 and is prepared by thermally decomposing a carbon-containing feed compound having 15 or less carbon atoms. To reduce transmission losses in the optical fiber from hydrogen diffusion and to improve mechanical properties of the optical fiber, the thickness of carbon coating layer 2 should be between 0.1 to 0.6 $\mu$m. When the thickness is less than 0.1 $\mu$m, thinner areas or pinholes form more easily. Hydrogen then diffuses through these weak areas into the body of the optical fiber and increases transmission losses. Increasing the thickness of carbon coating layer 2 beyond 0.6 $\mu$m is undesirable because it does little to improve the layer's capacity for preventing hydrogen penetration and it also tends to lead to the formation of cracks within the layer and exfoliation of the layer from the surface of the optical fiber 1.

Carbon coating layer 2 is prepared by thermally decomposing a hydrocarbon or halogenated hydrocarbon compound having 15 or less carbon atoms. Hydrocarbons with 15 or less carbon atoms that apply to this invention include hydrocarbons that are gaseous at normal temperatures such as ethane, propane, ethylene, methane, acetylene, and mixtures thereof; liquid hydrocarbons at normal temperatures such as pentane, hexane, octane, benzene, toluene, and mixtures thereof; and solid hydrocarbons at normal temperatures such as naphthalene. Halogenated hydrocarbons with 15 or less carbon atoms that apply to this invention include tetrafluoromethane, dichloromethane, dichloroethane, dichloroethylene, dichlorobenzene, trichloroethane, bromobenzene, and bromomethane. Considering the toxicities of the halogenated compounds, chlorine is preferable halogen atom. In particular, halogenated hydrocarbons with 2 carbon atoms are preferable because they deposit faster, forming a given thickness of carbon coating layer 2 in less time, and thus increasing optical fiber spinning efficiency. Hydrocarbons or halogenated hydrocarbons with 16 or more carbon atoms are undesirable for the present invention because they decompose too slowly to coat the uncoated optical fiber surfaces with carbon coating layer 2 efficiently. Thus, when the chemical vapor deposition process combines with the optical fiber spinning process, these hydrocarbons reduce the overall efficiency of the production process. Alcohols, ketones, esters, and other carbon compounds containing oxygen are undesirable for the present invention because they decompose too slowly to form carbon coating layer 2. Further, they produce more soot when decomposed, and this further reduces coating efficiency. Therefore, for the chemical vapor deposition process to coat the optical fiber efficiently, the feed hydrocarbon or halogenated hydrocarbon compound should have 15 or less carbon atoms. The feed hydrocarbon or halogenated hydrocarbon compound may be decomposed thermally by a resistance furnace, an induction furnace, or an infrared furnace, or they may be decomposed after being ionized. In the case of ionization, the feed hydrocarbon compound is diluted with an inert gas such as nitrogen, helium, or argon, and is subjected to high-frequency waves or microwaves to generate plasma.

Carbon coating layer 2 may be prepared by thermally decomposing a hydrocarbon or halogenated hydrocarbon compound between 400° and 1100° C. The thermal decomposition temperature is at least 400° C. for carbonization of the feed compounds. Increasing the temperature beyond 1100° C., on the other hand, is undesirable because it damages the carbon coating layers' ability to prevent hydrogen penetration and generates strains within the optical fiber body, increasing transmission losses and reducing mechanical strength. Furthermore, high temperatures cause spun quartz to change its crystal structure. Since the annealing temperature of quartz is around 1170° C., overheating releases compressive stresses on the fiber's surface, thereby reducing elasticity of the fiber and making it fragile. Therefore, the temperature at which the feed compounds are decomposed to form the carbon coating layer that increases hydrogen-resistance and mechanical strength of the optical fiber is preferably between 400° and 1100° C. The choice of feed compound is not limited, but a hydrocarbon or halogenated hydrocarbon compound with 15 or less carbon atoms is preferable.

Carbon coating layer 2 may also be prepared by thermally decomposing a hydrocarbon or halogenated hydrocarbon compound with 15 or less carbon atoms between 400° and 1100° C. When carbon coating layer 2 is prepared under the above conditions, it is free of pinholes, very capable of preventing hydrogen penetration, and hence highly desirable. The above conditions have another advantage in that they accelerate the deposition of carbon coating layer 2. If necessary the carbon coating layer 2 may be further coated with another carbon coating layer 3.

FIG. 2 is another optical fiber according to the present invention, where an uncoated optical fiber 1 is coated with two carbon coating layers-an inner coating layer 2a, and an outer coating layer 2b. The thickness of each carbon coating layer is preferably less than 0.6 $\mu$m and the combined thickness is preferably 0.1 $\mu$m or more. A combined thickness of less than 0.1 $\mu$m is undesirable because then the carbon coating layers are thin enough to allow hydrogen penetration and the transmission losses of the optical fiber are thereby increased. For either layer, a thickness of over 0.6 $\mu$m is also undesirable because it tends to lead to pinholes and other defects in the coating layer from which cracks propagate. Excessive thickness may also lead to exfoliation of the carbon coating layer 2 from the uncoated optical fiber 1. The two-layer structure allows production of a better carbon coating layer 2 with an enhanced capacity to prevent hydrogen penetration. If fine pinholes form during the production of carbon coating layer 2a, their growth can be controlled because carbon coating layer 2a is coated with carbon coating layer 2b. This structure also yields a thicker carbon coating layer and thereby reduces transmission losses and improves the mechanical strength of the optical fiber. Outer carbon coating layer 2b may be further coated with a third and fourth layer of carbon or resin. Coating carbon coating layer 2 with one or more resin coating layers 3 will impart greater mechanical strength and enhance the capacity to prevent hydrogen penetration into the optical fiber 2.

A hydrocarbon or halogenated hydrocarbon compound can be the feed compound for inner coating layer 2a and outer coating layer 2b, as is the case with the optical fiber shown in FIG. 1. Feed compounds with 15 or less carbon atoms are preferable because they form the coating layer faster. In particular, halogenated aliphatic hydrocarbon compounds with 2 carbon atoms are best because they deposit fastest, forming a given thickness of carbon coating in the least amount of time, thus increasing optical fiber spinning efficiency. Hydrocarbons or halogenated hydrocarbons with 16 or more carbon atoms are undesirable for this invention because they decompose too slowly to efficiently coat the optical fiber surface using the chemical vapor deposition process in which the feed compounds are vaporized. When the chemical vapor deposition process is combined with the optical fiber spinning process, compounds with 16 or more carbon atoms reduce the efficiency of the overall optical fiber production process. For halogenated hydrocarbons, it is better to substitute hydrogen atoms with chlorine atoms because chlorine is less toxic. Carbon compounds which contain oxygen such as alcohols, ketones, and esters are undesirable because they decompose too slowly to form the carbon coating layer 2. It is not necessary for the feed compounds used in forming the carbon coating layers 2a and 2b to be the same.

Using different feed compounds for carbon coating layers 2a and 2b can improve the mechanical strength of the optical fiber. The optical fiber is coated with inner carbon coating layer 2a and outer carbon coating layer 2b. The inner layer is softer and has a lower modulus of elasticity, it absorbs stresses exerted on the fiber body and relaxes compressive stresses exerted on the surface of the uncoated optical fiber 1, while carbon coating layer 2 is deposited to absorb the strains within the uncoated optical fiber 1. This structure, therefore, can improve the mechanical strength of the optical fiber. Outer layer 2b is harder than inner layer 2a. Layer 2b protects the optical fiber from external stresses, thereby additionally improving mechanical strength of the optical fiber. The modulus of elasticity of carbon coating layer 2 covering the surface of optical fiber 1 can be changed by changing the feed compound, or by changing the forming conditions, such as the thermal decomposition temperature. In the preparation of the optical fiber of the present invention, the carbon coating layers 2a and 2b of different moduli of elasticity are formed easily by limiting the feed compound in which the inner carbon coating layer 2a is prepared to an aromatic or halogenated aromatic hydrocarbon compound and the outer carbon coating layer 2b to an aliphatic or halogenated aliphatic hydrocarbon compound.

Inner carbon coating layer 2a, prepared by thermally decomposing an aromatic or halogenated aromatic hydrocarbon compound, is lower in modulus of elasticity (1 to 8 GPa) and softer, while outer carbon coating layer 2b, prepared by thermally decomposing an aliphatic or halogenated aliphatic hydrocarbon compound, is higher in modulus of elasticity (10 to 15 GPa) and harder. Inner carbon coating layer 2a, therefore, reduces shrinking created while it is being produced. It absorbs strains present in, and external stresses exerted on the uncoated optical fiber 1, thus improving mechanical strength. Outer carbon coating layer 2b being denser and harder than inner carbon coating layer 2a, is better at preventing hydrogen penetration. Thus it greatly reduces transmission losses and at the same time protects the uncoated optical fiber 1 from external stresses. The optical fiber is, therefore, highly resistant to hydrogen and mechanically strong. Inner carbon coating layer 2a relaxes shrinkage created while carbon coating layer 2 is being produced and absorbs strains present in the uncoated optical fiber. Outer carbon coating layer 2b, because it is sufficiently hard and dense, effectively prevents hydrogen in the ambient atmosphere from penetrating into the body of the optical fiber.

An aromatic or halogenated aromatic hydrocarbon compound may serve as the feed compound to form inner carbon coating layer 2a. Compounds applicable to this invention include aromatic hydrocarbons, such as toluene, xylene, chlorobenzene, and styrene. Aromatic hydrocarbons with 15 or less carbon atoms in which a hydrogen atom on the benzene ring is substituted by a hydrocarbon group or a halogen atom, preferably a chlorine atom, and mixtures thereof are suitable. A variety of aliphatic and halogenated aliphatic hydrocarbons may be used as the feed compounds to form outer carbon coating layer 2b. Halogenated aliphatic hydrocarbons applicable to this invention include tetrafluoromethane, dichloromethane, dichloroethane, dichloroethylene, trichloroethane, bromomethane, and mixtures thereof. Of these, compounds such as 1,1-dichloroethane, 1,2-dichloroethane, cis-1,2-dichloroethylene, trans-1,2-dichloroethylene, 1,1,1-trichloroethylene and, 1,1,2-trichloroethane which have 2 carbon atoms, and in which hydrogen is substituted by chlorine are preferable.

The above compounds decompose at the temperature at which they are carbonated. For aromatic and halogenated aromatic hydrocarbons, which are preferable feed compounds for forming inner carbon coating layer 2a, a decomposition temperature of 900° to 1100° C. is best. For halogenated hydrocarbons with 2 carbon atoms, which are preferable feed compounds for forming the outer carbon coating layer 2b, thermal decomposition should take place between 500° and 900° C. Thermal decomposition will not take place at temperatures below the above ranges. Increasing the temperature beyond the above ranges, on the other hand, is undesirable because it generates strains within the optical fiber body, thereby increasing transmission losses and reducing mechanical strength. Furthermore, since the annealing temperature of quartz is around 1170° C., high temperatures reheat the spun quartz and change its crystal structure. This releases compressive stresses acting on the surface and thereby reduces the fiber's elasticity and makes it fragile.

Coating an optical fiber with two layers serves to make the fiber have hydrogen-resistant and mechanically strong. The inner layer for the optical fiber is prepared by thermally decomposing a halogenated hydrocarbon compound of which at least half of the hydrogen atoms in the molecule are substituted by halogen atoms. The second layer is prepared by thermally decomposing a halogenated hydrocarbon compound of which less than half of the hydrogen atoms in the molecule is substituted by halogen atoms. Halogenated hydrocarbons used as feed compounds for forming the inner and outer carbon coating layers ($2a$ and $2b$) should have 15 or less carbon atoms so that they can decompose quickly in forming the carbon coating layer. Halogenated hydrocarbons with 16 or more hydrocarbons are undesirable because they decompose and carbonate too slowly. To minimize toxicity of the halogenated compounds, the hydrogen atoms in these compounds should be substituted by chlorine atoms.

Halogenated hydrocarbons which are preferable as feed compounds for forming inner carbon coating layer $2a$ include $CCl_4$, $CHCl_3$, $CF_4$, $CHF_3$, $C_2Cl_6$, $C_2HCl_5$, $C_2H_2Cl_4$, $C_2F_6$, $C_2HF_5$, $C_2H_2F_4$, $C_2H_3Cl_3$, $C_2H_3F_3$, $CH_2Cl_2$, and $CH_2F_2$. Halogenated hydrocarbons which are preferable as feed compounds for forming outer carbon coating layer $2b$ include $CH_3Cl$, $CH_3F$, $C_2H_5Cl$, $C_2H_4Cl_2$, $C_2H_5F$, and $C_2H_4F_2$.

Thermal decomposition of a hydrocarbon compound generates CH radicals and H radicals. CH radicals react to form carbon coating layer 2 over the surface of the uncoated optical fiber 1, whereas H radicals react with Si-O groups on the surface of the optical fiber 1 to form Si-OH groups. These Si-OH groups erode fine defects on the surface, reducing the mechanical strength of the optical fiber 1. Thermal decomposition of the hydrocarbon compound, where at least half of the hydrogen atoms in the molecule are substituted by halogen atoms, produces large quantities of halogen radicals, CH radicals and H radicals. Because halogen radicals capture the H radicals, which would otherwise produce Si-OH groups on the surface of the uncoated optical fiber 1, they reduce surface erosion, thereby improving the hydrogen resistance and mechanical strength of the uncoated optical fiber 1.

Furthermore, to secure sufficient hydrogen-resistant characteristics, inner coating layer $2a$ is coated with outer carbon coating layer $2b$. Since the inner layer is prepared by thermally decomposing a hydrocarbon compound having a number of hydrogen atoms substituted by halogen atoms, the relative percentage of carbon atoms is reduced. Thermal decomposition of a hydrocarbon compound where less than half of the hydrogen atoms in the molecule is substituted by halogen atoms for the outer carbon coating layer $2b$ produces more H-radicals that can generate Si-OH groups when contacting the surface of the uncoated optical fiber 1. The uncoated optical fiber 1, however, is less eroded by Si-OH groups because it is already protected by the inner carbon coating layer $2a$ when the outer carbon coating layer $2b$ is being deposited. Thermal decomposition of a hydrocarbon compound where less than half of the hydrogen atoms in the molecule is substituted by halogen atoms produces the outer coating layer $2b$ over the inner coating layer $2a$, the former being characterized by higher resistance to hydrogen penetration because it contains less halogen atoms. As a result, the optical fiber has good mechanical strength and hydrogen-resistance characteristics. The optical fibers can be produced by coating the surfaces of the optical fiber spun by an optical fiber spinning furnace with the inner carbon coating layer $2a$ and the outer carbon coating layer $2b$, either continuously or batchwise.

FIG. 3 shows the apparatus for producing optical fiber 1 and coating it with carbon layers. The uncoated optical fiber 1 is produced by spinning the optical fiber material (not shown) in a in a heated optical fiber spinning furnace 4. It is then passes to a chemical vapor-phase growth reactor furnace 5, which is housed in the lower stage of the optical fiber spinning furnace 4. The chemical vapor-phase growth reactor furnace 5 contains reactor furnaces 6 connected in series and kept air-tight. Each reactor furnace 6 consists of nearly cylindrical reactor tubes 7 which are heated by heaters 8. In the reactor tubes 7, chemical vapor-phase growth reactions are activated to coat the uncoated optical fiber 1 with carbon coating layer 2. Each reactor tube 7 has a feed compound supply tube 9 at the top, through which the feed compound is charged, and an exhaust tube 10 at the bottom, through which unreacted gas is exhausted. Many types of reactor tubes 7 and heaters 8 can be employed, depending on the temperature at which the feed compounds decompose. The feed compound may be decomposed thermally by a resistance furnace, induction furnace, or infrared furnace. Or the heater 8 may produce plasma by high-frequency waves or microwaves to ionize and decompose the feed compound. The chemical vapor-phase growth reactor 5 also has gas supply tubes at the top 11 and bottom 11, through which an inert gas such as helium or nitrogen is blown in to eliminate oxygen. The chemical vapor-phase growth reactor furnace 5 is followed by a resin coating unit 12 and a resin hardening unit 13 connected in series. These units coat the carbon coating layers formed over the uncoated optical fiber 1 in the reactor furnace with a resin coating layer 3.

Using this apparatus the optical fibers of the present invention are produced in the following manner:

The optical fiber material is spun in a heated optical fiber spinning furnace 4 into the uncoated optical fiber 1. The uncoated optical fiber 1 feeds down to the chemical vapor-phase reaction furnace 5, where it passes through the reactor tubes 7, the resin coating unit 12, and the resin hardening unit 13 successively, running at a given speed along the axes of these units. Then, the heaters start to heat the fibers running through the reaction tubes 7 to a given temperature. At the same time, the inert gas and the feed compound feed into the chemical vapor-phase reaction furnace 5 via the gas supply tubes 11 and the feed compound supply tubes 9, respectively. The feed compound for forming carbon coating layer 2 may vary so long as it is a carbon compound which thermally decomposes into carbon coating layer 2. It may be supplied in a gaseous state, or diluted with an inert gas. The feed supply rate can also vary widely depending on the type of feed compound and on the temperature at which it decomposes. The feed supply rate will generally be from 0.2 to 1.02 L/min. The thermal decomposition temperature varies depending on the type of feed compound, but is generally from 400° to 1100° C. Thermal decomposition will not take place below 400° C. Increasing the temperature beyond 1100° C. is also undesirable. Excessive heat generates large quantities of by-product soot and at the same time makes carbon coating layer 2 fragile. It also makes the optical fiber fragile and less elastic because the annealing temperature of the quartz which makes up the optical fiber is 1170° C. In order to minimize formation of by-product soot, it is best to keep the reactor tubes 7 slightly below the thermal decomposition temperature of the feed compound. Thus coated with carbon coating layer 2, the optical fiber 1 then passes to the resin coating unit 12 and the resin hardening unit 13 installed below the chemical vapor-phase growth furnace 5. In the resin coating unit 12, it is further coated with an ultraviolet-setting or a thermo-setting resin. To form resin coating layer 3, the resin coating layer over the carbon coating layer is hardened in the resin hardening unit 13 under conditions suited for the resin coating.

This configuration of the chemical vapor-phase growth reaction furnace 5, in which reaction furnaces 6 are connected in series, allows for increased contact time between the carbon radicals and the uncoated optical fiber 1 in the entire chemical vapor-phase reaction furnace 5. This configuration also decreases contact time in the reaction furnaces 6, so the uncoated optical fiber 1 can be coated efficiently with a high-quality carbon coating layer 2. It further has the advantage of permitting higher optical fiber spinning rates.

The carbon radicals formed in the reaction furnaces 6, if not deposited over the uncoated optical fiber 1, are exhausted immediately through each of the exhaust tubes 10 so that they do not react with each other to form a polymer in the reactor tubes 7. Therefore, carbon coating layer 2 over the uncoated optical fiber 1 is of made low molecular weight carbon radicals. Hence, it always has a uniform, tight structure, and effectively prevents hydrogen penetration. In the above apparatus, the carbon radicals are deposited directly over the uncoated optical fiber 1 to form carbon coating layer 2 in the uppermost reaction furnaces 6. Later, in the downstream reaction furnaces 6, carbon radicals are again deposited over the carbon coating layer 2 to increase its thickness.

Since carbon coating layer 2 is produced in two stages, growth of pinholes is kept to a minimum. Carbon coating layers 2 produced this way contain less pinholes than coating layers of the same thickness produced by a one-stage apparatus, and so are more effective in preventing hydrogen penetration.

The apparatus shown in FIG. 3 has 3 reaction furnaces 6 connected in series. The number of reaction furnaces in this invention is not limited, so long as 2 or more reaction furnaces are connected in series. The number of reaction furnaces can vary depending on the feed compound, the spinning rate, and other conditions. The apparatus shown in FIG. 3 has a chemical vapor-phase growth reaction furnace 5 connected below the optical fiber spinning furnace 4. The optical spinning furnace 4 and the chemical vapor-phase growth reaction furnace 5 may be connected to each other and to the resin coating unit 12 and the resin hardening unit 13 in any configuration so long as they are all kept air tight. The optical fibers shown in FIG. 2 are easily produced by this apparatus, in which two reaction furnaces are connected in series, with the feed compound being supplied to the upper reaction furnace 6 to form inner carbon coating layer 2a, and to the lower reaction furnace 6 to form outer carbon coating layer 2b. The present invention will be described further with reference to the following examples.

EXAMPLES

Example 1

A resistance furnace was connected to a 40 mm i.d. quartz tube in a spinning unit in which the optical fiber material was spun into an uncoated optical fiber. Optical fiber material, with an outer diameter of 30 mm, and with a core impregnated with $GeO_2$ as a dopant, was placed in the spinning unit. The material was spun at 2000° C. and at a spinning speed of 30 m/min into a fiber of 125 μm o.d. Benzene vapor diluted with argon gas to about 1% by volume was used as the feed compound. The vapor-gas mixture was then fed at about 5 1/min to the reaction tubes and kept at 1000° C., while the uncoated optical fibers were coated with the carbon coating layer. As confirmed by electron microscopic analysis, the thickness of the carbon coating layer was uniform, at 0.1 to 0.3 μm over a fiber length of 1 km.

Example 2

The same procedure as described in Example 1 was followed, except that to form the carbon coating layer, benzene vapor diluted with argon gas to about 10% by volume was used as the feed compound. The thickness of the carbon coating layer was 0.6 to 1.0 μm over a fiber length of 1 km.

Example 3

The same procedure as described in Example 1 was followed, except that to form the carbon coating layer, 1,2-dichloroethane diluted with argon gas to about 1% by volume was used as the feed compound.

Example 4

The same procedure as described in Example 1 was followed, except that to form the carbon coating layer, 1,1,1-trichloroethane diluted with argon gas to about 1% by volume was used as the feed compound, and the resistance furnace was heated to achieve 500° C. in the reaction tubes. As confirmed by electron microscopic analysis, the thickness of the carbon coating layer was 0.1 to 0.3 μm over a fiber length of 1 km.

Example 5

The same procedure as described in Example 1 was followed, except that to form the carbon coating layer, 1,2-dichloroethylene diluted with argon gas to about 1% by volume was used as the feed compound, and the resistance furnace was heated to 600° C. for the reaction tubes.

Example 6

The same procedure as described in Example 1 was followed, except that to form the carbon coating layer, dichloromethane diluted with argon gas to about 1% by volume was used as the feed compound, and the resistance furnace was heated to attain 800° C. in the reaction tubes. As confirmed by electron microscopic analysis, the thickness of the carbon coating layer was 0.1 to 0.2 μm over a fiber length of 1 km.

Example 7

The same procedure as described in Example 1 was followed, except that to form the carbon coating layer, vinyl-naphthalene diluted with argon gas to about 1% by volume was used as the feed compound, and the resistance furnace was heated to attain 1100° C. in the reaction tubes.

Example 8

The optical fiber prepared in Example 1 was coated further with a urethane acrylate resin which was hardened by ultraviolet light to form an optical fiber with an outer diameter of about 250 μm. The fiber was passed through a die pot filled with the liquified resin (Young's modulus: 50 kg/mm², elongation: 10% at a linear speed of 60 m/min.

Example 9

The same procedure as described in Example 1 was followed, except that to form the carbon coating layer, the resistance furnace was heated to attain 1200° C. in the reaction tubes.

Example 10

The same procedure as described in Example 1 was followed, except that to form the carbon coating layer, n-hexanol diluted with argon gas to about 1% by volume was used as the feed compound.

Example 11

The same procedure as described in Example 1 was followed, except that the resistance furnace was heated to attain 1100° C. in the reaction tubes and naphthalene diluted with argon gas to about 1% by volume was used as the feed compound.

Example 12

The same procedure as described in Example 1 was followed, except that to form the carbon coating layer, the resistance furnace was heated to 400° C., and 1,2-trans-dichloroethylene diluted with argon to about 1% by volume was used as the feed compound.

Comparison Example 1

A 30 mm o.d. optical fiber material with a core impregnated with $GeO_2$ as a dopant was spun into 125 μm fibers at 2000° C. and at a speed of 30 m/min.

Test 1

The 500 m long optical fibers prepared in Examples 1 through 12 and Comparison Example 1 were measured for their light transmission losses at wavelengths of 1.24 and 1.39 μm, where absorption by OH groups occurs. Each tested fiber was then kept for 24 hours in a tightly sealed container at 150° C. and at a hydrogen partial pressure of 1 atm. The fibers were again measured at the same wavelengths for light transmission losses to determine the differential transmission loss caused by penetration of hydrogen. The results are shown in Table 1.

Test 2

The optical fibers prepared in Examples 1 through 12 and Comparison Example 1 were measured for their tensile strength. Twenty fibers from each sample were subjected to pulling stresses under a gauge length of 30 cm and a strain rate of 10%/min. To determine tensile strength at a 50% fracture probability, fracture probability was plotted against tensile strength in a Weibull plot. The results are also shown in Table 1.

These test results show that compared to the uncoated carbon fiber prepared in Comparison Example 1, the carbon-coated optical fibers prepared in Examples 1 through 12 are lower in differential transmission loss caused by the penetration of hydrogen and higher in tensile strength.

TABLE 1

| Sample | Light Transmission Losses (Δ dB/km) Measurement 1.24 μm | Wavelength 1.39 μm | Tensile Fracture Strength (kg/125 mm diameter) 50% Probability of Fracture |
| --- | --- | --- | --- |
| Example 1 | 0.5 | 1.8 | 4.5 |
| Example 2 | 0.4 | 1.9 | 3.0 |
| Example 3 | 1.1 | 2.2 | 4.3 |
| Example 4 | 1.3 | 2.7 | 4.8 |
| Example 5 | 0.7 | 1.9 | 4.1 |
| Example 6 | 0.8 | 2.5 | 4.7 |
| Example 7 | 0.9 | 2.3 | 4.6 |
| Example 8 | 0.4 | 1.5 | 5.9 |
| Example 9 | 5.8 | 4.9 | 2.4 |
| Example 10 | 15.7 | 28 | 3.6 |
| Example 11 | 16.0 | 30.8 | 3.7 |
| Example 12 | 11.8 | 31.0 | 3.9 |
| Comparison Example 1 | 17.3 | 30 | 3.5 |

Example 13

Two resistance furnaces, connected in series and kept air-tight, were connected to a 40 mm i.d. quartz tube in a spinning unit in which the optical fiber material was spun into an uncoated optical fiber. Single-mode optical fiber material with an outer diameter of 30 mm and with a core impregnated with $GeO_2$ as a dopant was placed in the spinning unit, where it was spun into 125 μm o.d. single-mode optical fibers at 2000° C. and at a spinning speed of 30 m/min. Benzene vapor diluted with argon gas to about 5% by volume was used as the feed compound. To coat each of the uncoated optical fibers with an inner carbon coating layer, the vapor-gas mixture was then supplied to the reaction tubes at about 0.5 l/min while the upper resistance furnace was heated to 1000° C. Each of the optical fibers was then coated further with an outer carbon coating layer by charging at about 0.2 l/min, trans-1,2 dichloroethylene vapor diluted with argon gas to about 3% by volume as the feed compound. The lower resistance furnace was heated to 700° C. in the reaction tubes. As confirmed by electron microscopic analysis, the thickness of the combined carbon coating layer was uniform at 0.1 to 0.3 μm over a fiber length of 1 km.

Example 14

The same procedure as described in Example 13 was followed, except that monochlorobenzene vapor diluted with argon gas to about 10% by volume was used as the feed compound to form the inner carbon coating layer in the upper resistance furnace, and 1,1,1-trichloroethane diluted with argon gas to about 5% by volume was used as the feed compound to form the outer carbon coating layer over the inner carbon coating layer in the lower resistance furnace. The thickness of the carbon coating layer was 0.2 to 0.4 μm over a fiber length of 1 km.

Example 15

The same procedure as described in Example 13 was followed, except that about 0.4 l/min of toluene vapor diluted with argon gas to about 3% by volume was used as the feed compound to form the inner carbon coating layer in the upper resistance furnace which was kept at 1100° C. and about 0.3 l/min of 1,2-dichloroethane vapor diluted with argon gas to about 5% by volume was used to form the outer carbon coating layer over the inner carbon coating layer in the lower resistance furnace which was kept at 800° C.

Example 16

The optical fiber prepared in Example 13 was coated further with a urethane acrylate resin which was hardened by ultraviolet light to form an optical fiber of 250 μm o.d.. The fiber was coated by passing it through a die pot filled with the liquified resin (Young's modulus: 50 kg/mm$^2$, elongation: 10%) at a linear speed of 60 m/min.

Example 17

The same procedure as described in Example 13 was followed, except that about 0.2 1/min of trans 1,2-dichloroethylene vapor diluted with argon gas to about 3% by volume was used as the feed compound to form the inner carbon coating layer in the upper resistance furnace which was kept at 700° C., and 0.5 1/min of benzene vapor diluted with argon gas to about 5% by volume was used as the feed compound to form the outer carbon coating layer over the inner carbon coating layer in the lower resistance furnace which was kept at 1000° C.

Comparison Example 2

The same procedure as described in Example 1 was followed, except that to form the carbon coating layer, about 0.5 1/min of benzene vapor diluted with argon gas to about 5% by volume was used as the feed compound.

Comparison Example 3

The same procedure as described in Example 1 was followed, except that to form the carbon coating layer, the resistance furnace was heated to 100° C. for the reaction tubes and about 0.2 1/min of trans-1,2-dichloroethylene vapor diluted with argon gas to about 3% by volume was used as the feed compound.

Test 3

The 500 m long optical fibers prepared in Examples 13 through 17 and Comparison Examples 1 through 3 were measured for their light transmission losses at wavelengths of 1.24 and 1.39 μm, where absorption by OH groups occurs. Each of the tested fibers was then kept for 200 hours in a tightly sealed container at 100° C. and at hydrogen partial pressure of 1 atm. To determine the differential transmission loss caused by hydrogen penetration, the fibers were again measured at the same wavelengths for their light transmission losses. The results are shown in Table 2 as Comparison Examples 2 and 3, respectively.

Test 4

The optical fibers prepared in Examples 13 through 17 and Comparison Examples 1 through 3 were measured for their tensile strength. 20 fibers from each sample were subjected to pulling stresses under a gauge length of 30 cm at a strain rate of 10%/min. To determine tensile strength at a 50% fracture probability, fracture probability was plotted against tensile strength in a Weibull plot. The results are also shown in Table 2.

TABLE 2

| Sample | Light Transmission Losses (Δ dB/km) Measurement 1.24 μm | Wavelength 1.39 μm | Tensile Fracture Strength (kg/125 mm diameter) 50% Probability of Fracture |
|---|---|---|---|
| Example 13 | 0.9 | 1.8 | 5.1 |
| Example 14 | 0.7 | 1.5 | 5.0 |
| Example 15 | 1.0 | 1.9 | 4.9 |
| Example 16 | 0.9 | 1.8 | 5.8 |
| Example 17 | 1.0 | 2.0 | 4.0 |
| Comparison Example 2 | 2.0 | 4.5 | 4.8 |
| Comparison Example 3 | 0.9 | 1.9 | 3.8 |

These test results show that the optical fibers prepared in Examples 13 and 17, coated with inner and outer carbon coating layers, are lower in differential transmission loss caused by hydrogen penetration. They are also mechanically stronger and hence more practical and better balanced than both the uncoated fiber prepared in Comparison Example 1 and the fibers coated with the single carbon coating layer prepared in Comparison Examples 2 and 3. Most noteworthy are the optical fibers coated with two carbon coating layers prepared in Examples 13 through 16. They are high quality fibers with low differential transmission losses from hydrogen penetration and high tensile strengths. The inner carbon coating layers were prepared by decomposing an aromatic or halogenated aromatic compound, the outer layers were prepared by decomposing an aliphatic or halogenated aliphatic compound. Since it has a resin coating layer over the carbon coating layer, the optical fiber prepared in Example 16 is lower in differential transmission losses from hydrogen penetration and higher in mechanical strength.

Example 18

An optical fiber coated with two carbon coating layers was prepared using the same apparatus as described in Example 13. To form the inner carbon coating layer over the uncoated optical fiber, a feed compound of 1,1,1-trichloroethane gas diluted with argon gas to about 5% by volume was fed through the upper feed compound supply tube at a rate of 3 1/min. The upper reaction furnace was kept at 1200° C. The unreacted gas was purged through the exhaust pipe, which was maintained at a vacuum of −4 mm of H$_2$O. To form the outer carbon coating layer over the inner carbon coating layer, a feed compound of 1,2-dichloroethane diluted with argon gas to about 5% by volume was fed through the lower feed compound supply tube at a rate of 3 1/min. The lower reaction furnace was kept at 1300° C. The unreacted gas was purged through the exhaust tube, which was maintained at a vacuum of −1 mm of H$_2$O. Once coated with the two carbon coating layers, the optical fiber was coated further with a urethane acrylate resin by passing it through a die pot filled with the liquefied UV resin (Young's modulus: 70 kg/mm$^2$, elongation: 60%). The resin layer was hardened by a UV lamp. The final optical fiber with the resin protective layer had an outer diameter of 300 μm.

Example 19

The same procedure as described in Example 18 was followed, except that to form the inner carbon coating layer, 1,1,2-tetrachloroethane was used as the feed compound.

Example 20

The same procedure as described in Example 18 was followed, except that to form the outer carbon coating layer, chlorobenzene was used as the feed compound.

Example 21

The same procedure as described in Example 18 was followed, except that to form the inner carbon coating layer, tetrachloroethylene was used as the feed compound.

Comparison Example 4

The same procedure as described in Example 18 was followed, except that to form the inner carbon coating layer, 1,2-dichloroethane was used as the feed compound.

Comparison Example 5

The same procedure as described in Example 18 was followed, except that to form the outer carbon coating layer, 1,1,1-trichloroethane was used as the feed compound.

Comparison Example 6

The same procedure as described in Example 18 was followed, except that dichloroethane and 1,1,1-trichloroethane were used as the feed compounds to form the inner and outer carbon coating layers, respectively.

Comparison Example 7

The same procedure as described in Example 18 was followed, except that chlorobenzene and 1,1,2,2-tetrachloroethane were used as the feed compounds to form the inner and outer carbon coating layers, respectively.

Test 5

The optical fibers prepared in Examples 18 through 21 and Comparison Examples 4 through 7, in 1 km long bundles, were measured for their light transmission losses at a wavelength of 1.24 μm. Each tested bundle was then kept for 100 hours in a tightly sealed container at 80° C. and a hydrogen partial pressure of 1 atm. To determine the differential light transmission loss from hydrogen penetration, the fibers were again measured at the same wavelength for their light transmission loss. The results are shown in Table 3.

Test 6

The optical fibers prepared in Examples 18 through 21 and Comparison Examples 4 through 7 were measured for their tensile strength. Twenty fibers from each sample were subjected to pulling stresses under a gauge length of 3 m and a strain rate of 30 cm/min. To determine tensile strength at a 50% fracture probability, fracture probability was plotted against tensile strength in a Weibull plot. The results are also shown in Table 3.

TABLE 3

| Sample | Light Transmission Losses (Δ dB/km) | Tensile Strength (kg/fiber) |
| --- | --- | --- |
| Example 18 | 0.5 | 5.5 |
| Example 19 | 0.6 | 6.0 |
| Example 20 | 0.3 | 5.2 |
| Example 21 | 0.4 | 6.1 |
| Comparison Example 4 | 0.4 | 3.0 |
| Comparison Example 5 | 4.5 | 5.1 |
| Comparison Example 6 | 0.9 | 3.2 |
| Comparison Example 7 | 0.8 | 2.3 |

These results show that practical optical fibers were prepared in Examples 18 through 21. They have sufficient mechanical strength and resistance to hydrogen.

Example 22

An apparatus similar to that shown in FIG. 3, where 3 sets of 50 mm i.d. infrared furnaces were connected in series, was set up underneath the spinning furnace to produce uncoated optical fibers from optical fiber material. The total length of the furnace was 100 mm. Optical fiber material with an outer diameter of 30 mm and with a core impregnated with $GeO_2$ as a dopant was placed in the spinning unit installed in the optical fiber production apparatus. The optical fiber material was passed into the optical fiber production apparatus and spun into 125 μm o.d. single-mode fibers at 2000° C. and at a spinning speed of 20 m/min. The CVD furnace was kept at 1200° C. To coat each of the uncoated optical fibers with a carbon coating layer, a feed compound of 1,1,2-trichloroethane gas diluted with argon gas to about 5% by volume was fed through each feed supply tube at a rate of 3 l/min. The unreacted gas was purged through the exhaust pipe, which was maintained at a vacuum of −4 mm of $H_2O$. The carbon-coated optical fiber was coated further with a urethane acrylate resin by passing it through a die pot filled with liquefied UV resin (Young's modulus: 70 kg/mm², elongation: 60%). The resin layer was hardened by a UV lamp. The final optical fiber with the resin protective layer had an outer diameter of 300 μm.

Example 23

The same procedure as described in Example 22 was followed, except that benzene was used as the feed compound.

Example 24

The same procedure as described in Example 22 was followed, except that the spinning rate was set at 40 m/min.

Example 25

The same procedure as described in Example 22 was followed, except that 4 reaction tubes were used instead of 3, and the spinning rate was set at 60 m/min.

Comparison Example 8

The same procedure as described in Example 22 was followed, except that 2 of 3 feed supply tubes and 2 of 3 exhaust tubes were plugged.

Comparison Example 9

The same procedure as described in Comparison Example 8 was followed, except that the chemical vapor-phase growth reaction furnace was 300 mm long, 3 times longer than the furnace used in Example 22.

Test 7

The optical fibers prepared in Examples 22 through 25 and Comparison Examples 8 and 9 were measured for their carbon coating layer thickness. Fibers from each sample were then formed into bundles 150 mm in diameter and 1 km long. Each bundle was kept for 48 hours in a pressurized container at 80° C. and at a hydrogen partial pressure of 1 atm. To find the increase in hydrogen absorption losses, the fibers were again measured at a wavelength of 1.24 μm for differential transmission losses. The results are shown below in Table 4.

TABLE 4

| Sample | Light Transmission Losses (Δ dB/km) | Thickness of Carbon Coating Layer (Angstroms) |
|---|---|---|
| Example 22 | 0.21 | 1000 |
| Example 23 | 0.16 | 1200 |
| Example 24 | 0.57 | 800 |
| Example 25 | 0.30 | 1000 |
| Comparison Example 8 | 2.53 | 150 |
| Comparison Example 9 | 4.25 | 800 |

As shown in Table 4, the apparatus of this invention is capable of forming carbon coating layers of sufficient thickness at high spinning speeds. The results show that optical fibers produced by the apparatus are low in differential transmission losses from hydrogen. They also show that the carbon coating layer is dense enough.

Test 8

A feed compound of 1,1,1-trichloroethane was charged at 3 1/min to each of three apparatuses: that described in Example 22 (a 100 mm long furnace containing 3 reaction tubes): that described in Comparison Example 8 (the same apparatus as described in Example 22, except that 2 out of 3 supply tubes and 2 out of 3 exhaust tubes are plugged), and that described in Comparison Example 9 (the same apparatus as described in Comparison Example 8, except that the furnace is 300 mm long). The optical fiber material was spun at spinning speeds of 20, 40, and 60 m/min. The thickness of the carbon coating layers over each optical fiber was then determined by SEM photographic analysis. The results are shown in FIG. 4, where the solid line, broken line and chain line represent the results by the apparatuses described in Example 22, Comparison Example 8, and Comparison Example 9, respectively. As shown, the apparatus of the present invention, as described in Example 22, produces carbon coating layers at high spinning speeds which are thick enough to prevent hydrogen penetration.

What is claimed is:

1. An optical fiber coated with a carbon coating layer in which the carbon coating layer is formed by thermally decomposing a compound selected from the group consisting of an unsaturated halogenated hydrocarbon compound, an unsaturated non-halogenated hydrocarbon compound and a saturated halogenated hydrocarbon compound each having 15 or less carbon atoms at the temperature necessary to thermally decompose the compound.

2. An optical fiber as claimed in claim 1, wherein the temperature is in the range of from 400° to 1100° C.

3. An optical fiber comprising
    (1) an inner carbon coating layer formed over an uncoated surface of the optical fiber by thermally decomposing a compound selected from the group consisting of an aromatic and halogenated aromatic hydrocarbon compound, and
    (2) an outer carbon coating layer formed over the inner carbon coating layer by thermally decomposing a compound selected from the group consisting of an aliphatic and halogenated aliphatic hydrocarbon compound.

4. An optical fiber as claimed in claim 3, wherein the hydrocarbon compounds have 15 or less carbon atoms.

5. An optical fiber as claimed in claim 3, wherein the temperature for thermally decomposing the hydrocarbon compounds is in the range of from 400° to 1100° C.

6. An optical fiber as claimed in claim 3, wherein the hydrocarbon compounds have 15 or less carbon atoms, and the temperature for thermally decomposing the hydrocarbon compounds is in the range of from 400° to 1100° C.

7. An optical fiber as claimed in claim 3, wherein the thickness of each carbon coating layer is less than 0.6 μm or more.

8. An optical fiber comprising
    (1) an inner carbon coating layer formed over an uncoated surface of the optical fiber by thermally decomposing a hydrocarbon compound where at least half of the hydrogen atoms are substituted by halogen atoms, and
    (2) an outer carbon coating layer formed over the inner carbon coating layer by thermally decomposing a hydrocarbon compound where less than half of the hydrogen atoms are substituted by halogen atoms.

9. An optical fiber as claimed in claim 8, wherein the hydrocarbon compounds have 15 or less carbon atoms.

10. An optical fiber as claimed in claim 8, wherein the temperature for thermally decomposing the hydrocarbon compounds is in the range of from 400° to 1100° C.

11. An optical fiber as claimed in claim 8, wherein the hydrocarbon compounds have 15 or less carbon atoms, and the temperature for thermally decomposing the hydrocarbon compounds is in the range of from 400° to 1100° C.

12. An optical fiber as claimed in claim 8, wherein the thickness of each carbon coating layer is less than 0.6 μm, and the total thickness of the inner and outer carbon coating layers is 0.1 μm or more.

* * * * *